United States Patent

Griesbach

[11] Patent Number: 5,880,606
[45] Date of Patent: Mar. 9, 1999

[54] PROGRAMMABLE DRIVER CIRCUIT FOR MULTI-SOURCE BUSES

[75] Inventor: William R. Griesbach, Pocono Pines, Pa.

[73] Assignee: Lucent Technologies Inc., Murray Hill, N.J.

[21] Appl. No.: 757,061

[22] Filed: Nov. 26, 1996

Related U.S. Application Data

[60] Provisional application No. 60/007,886 Dec. 1, 1995.

[51] Int. Cl.$^6$ .............................................. H03K 19/0185
[52] U.S. Cl. .................................. 326/86; 326/49; 326/58
[58] Field of Search ........................... 326/83, 86, 57–58, 326/49–50, 121, 17, 27

[56] References Cited

U.S. PATENT DOCUMENTS

| | | | |
|---|---|---|---|
| 4,804,867 | 2/1989 | Okitaka et al. | 307/473 |
| 5,034,629 | 7/1991 | Kinugasa et al. | 326/58 |
| 5,036,222 | 7/1991 | Davis | 326/58 |
| 5,434,519 | 7/1995 | Trinh et al. | 326/83 |
| 5,497,105 | 3/1996 | Oh et al. | 326/83 |
| 5,570,043 | 10/1996 | Churchill | 326/27 |

FOREIGN PATENT DOCUMENTS

| | | | |
|---|---|---|---|
| 305980 A | 3/1989 | European Pat. Off. . | |
| 1562-967-A | 5/1990 | U.S.S.R. | 326/58 |

*Primary Examiner*—Jon Santamauro
*Attorney, Agent, or Firm*—David L. Smith

[57] ABSTRACT

There is disclosed an integrated circuit including a programmable driver circuit having first and second transistors. Each of the first and second transistors has first, second and third terminals. The first terminal of each of the first and second transistors are coupled together to form an input node. The second terminal of the first transistor is coupled to a power node. A third terminal of the first transistor is coupled to a first intermediate node. The second terminal of the second transistor is coupled to a second intermediate node. The third terminal of the second transistor is coupled to a reference potential. A first switch having at least one input is coupled between the first and second intermediate nodes. Third and fourth transistors each having first, second and third terminals. The first terminal of the third transistor is coupled to a third intermediate node. The first terminal of the fourth transistor is coupled to the second intermediate node. The second terminal of the third transistor is coupled to the power node. The third terminal of the third transistor is coupled to the second terminal of the fourth transistor to define an output node. The third terminal of the fourth transistor is coupled to the reference potential. A second switch having at least one control input is coupled between the third intermediate node and the first intermediate node.

15 Claims, 3 Drawing Sheets

PROGRAMMABLE DRIVER CIRCUIT FOR MULTI-SOURCE BUSES

This application claims U.S.C. Provisional No. 60/007,886, Dec. 1, 1995.

TECHNICAL FIELD

This invention relates generally to programmable driver circuits useful in integrated circuits and more particularly to programmable driver circuits that can be configured as a buffer for transferring data between an integrated circuit and more than one type of bus, or to isolate more than one type of bus from the integrated circuit.

BACKGROUND OF THE INVENTION

A three-state buffer, sometimes called a TRI-STATE™ buffer, is a circuit used to control transfer of signals, typically logic signals such as data, from its input to its output. A typical application as an output buffer is to drive data from an integrated circuit onto a bus, or to isolate the input of the three-state driver from the bus when data is not being driven onto the bus. A typical application as an input buffer is to permit data to be pulled off of a bus.

In microprocessors, such as a digital signal processor, the transfer of data takes place over a common set of conductors known as a bus. Some buses are unidirectional and permit signals to flow in only one direction on the bus, whereas other buses are bidirectional and permit signals to flow in either direction on the bus. Many integrated circuits in a system have inputs and outputs tied to a bus. Integrated circuits coupled to a bus are coupled through a three-state buffer that may be separate therefrom, but more commonly is an integral part of the integrated circuit.

A three-state buffer allows three possible output states: high, low, and high impedance. In the high impedance state, the output is an open or floating terminal that, as seen by the bus, is a high impedance to both ground and the power supply. Where multiple devices, such as integrated circuits, are coupled to a common bus, the three-state buffer permits controlling the transmission of signals from any one of the devices over the bus to other devices. The three-state buffer associated with the device providing the signal will be enabled to permit signals to pass through its three-state buffer and be driven onto the associated bus. Other output buffers coupled to the bus will be in a high impedance state, effectively disconnecting them from the bus. Some output buffers invert the signal as it is driven onto the bus; other output buffers drive a noninverted version of the signal onto the bus.

Buses of various types are in common use. Bus drivers are manufactured for each type of bus and are intended for use with a specific type of bus. When bus driver circuits were fabricated as separate integrated circuits, a system designer could select the appropriate bus driver circuits for a particular application. With higher levels of integrated circuit integration, the bus driver circuits are fabricated as part of the same integrated circuit as microprocessors, memories, and other devices that are coupled to a bus. Since each device may be used with any of the types of buses, it has been necessary to fabricate separate devices for each bus application. It would be desirable to fabricate only one type of each device with a programmable driver circuit that could be configured at the time of application for the particular type of bus being used in an application.

SUMMARY OF THE INVENTION

An integrated circuit includes a programmable output driver circuit having first and second transistors. Each of the first and second transistors has first, second and third terminals. The first terminal of each of the first and second transistors are coupled together to form an input node. The second terminal of the first transistor is coupled to a power node. A third terminal of the first transistor is coupled to a first intermediate node. The second terminal of the second transistor is coupled to a second intermediate node. The third terminal of the second transistor is coupled to a reference potential. A first switch having at least one input is coupled between the first and second intermediate nodes. Third and fourth transistors each having first, second and third terminals. The first terminal of the third transistor is coupled to a third intermediate node. The first terminal of the fourth transistor is coupled to the second intermediate node. The second terminal of the third transistor is coupled to the power node. The third terminal of the third transistor is coupled to the second terminal of the fourth transistor to define an output node. The third terminal of the fourth transistor is coupled to the reference potential. A second switch having at least one control input is coupled between the third intermediate node and the first intermediate node.

DETAILED DESCRIPTION

Figure 1:
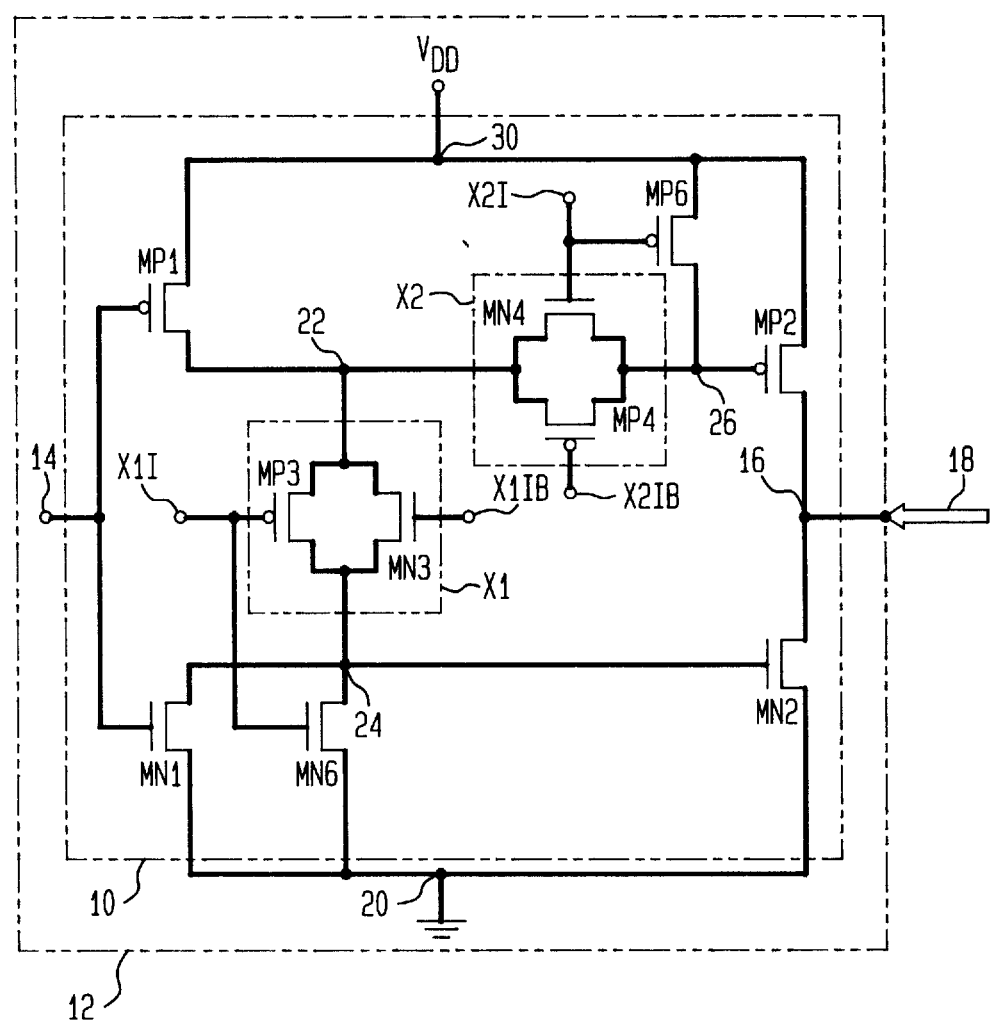
FIG. 1 is a schematic diagram of a programmable three-state output driver circuit, in an integrated circuit, that is configurable as an open-drain driver circuit, in accordance with the present invention.

FIG. 1 shows a schematic diagram of an output driver circuit 10, known as a three-state driver circuit or buffer, in accordance with an illustrative embodiment of the invention. Output driver circuit 10 is part of an integrated circuit 12; there may be several driver circuits 10 in integrated circuit 12. Output driver circuit 10 provides a buffer between input node 14, which is the input to output driver circuit 10, and output node 16, which is the output of output driver circuit 10. Signals or data produced or processed on integrated circuit 12 are coupled (not shown) to input node 14 to be presented at output node 16 and driven onto bus 18.

Output driver circuit 10 is essentially two inverters coupled between input node 14 and output node 16. Transistors MP1 and MN1 comprise a first inverter. Transistors MP2 and MN2 comprise a second inverter.

Output driver circuit 10 receives data at input node 14 for transfer to output node 16 to be driven onto bus 18. The data is in the form of a sequence of high and low logic levels. Output node 16 is coupled to a pad (not shown) which in turn is coupled to a pin of the integrated circuit package (also not shown). The pin is adapted to couple to one conductor of multiconductor bus 18 when integrated circuit 12 is mounted to a circuit board (not shown). By transferring data presented at the input node 14 from input node 14 from output node 16, data is transferred from integrated circuit 12 to a bus such as bus 18.

The illustrative embodiment of the invention shown in FIG. 1 employs metal oxide semiconductor transistors, however, the invention is not limited thereto. Output driver circuit 10 includes P-channel transistors MP1, MP2, MP3, MP4, and MP6, as well as N-channel transistors MN1, MN2, MN3, MN4, and MN6. Transistors MP1 and MN1 are coupled as a first inverter between a power node 30 which is in turn coupled to a power supply $V_{DD}$ and a reference potential 20, such as ground. The source of transistors MP1 is coupled to power node 30. The drain of transistor MP1 is coupled to node 22, and to the source of transistor MN1, node 24, through transmission switch X1. The drain of transistor MN1 is coupled to reference potential 20. The gate of transistors MP1 and MN1 are each coupled to input node 14 to receive data from integrated circuit 12 for transfer to output node 16 and bus 18.

Transistors MP2 and MN2 are coupled as a second inverter between power node 30 and reference potential 20. The source of transistor MP2 is coupled to power node 30. Resistor R1 is coupled between the drain of transistor MP2 and output node 16. Resistor R2 is coupled between output node 16 and the source of transistor MN2. The drain of transistor MN2 is coupled to reference potential 20. The gate of transistor MN2 is coupled to node 24 and to the source of transistor MN1, which is also coupled to node 24. The gate of transistor MP2 is coupled to node 26 and to node 22 and the drain of transistor MP1 through transmission switch X2. Transistors MP2 and MN2 are sized larger than the other transistors to drive the bus by sourcing or sinking current. Resistors R1 and R2 are impedance matching resistors, typically in the range of 30 ohms, to match a 50 ohm impedance bus. Resistors R1 and R2 typically would not be present in a driver circuit application internal to integrated circuit 12.

Transistor MP6 is coupled between power node 30 and node 26. The source of transistor MP6 is coupled to power node 30. The drain of transistor MP6 is coupled to node 26. The gate of transistor MP6 is coupled to input X2I of transmission switch X2.

Transistor MN6 is coupled between node 24 and reference potential 20. The source of transistor MN6 is coupled to node 24. The drain of transistor MN6 is coupled to the reference potential. The gate of transistor MN6 is coupled to input X1I of transmission switch X1.

Transmission switch X1 is comprised of transistors MP3 and MN3 coupled between node 22 and node 24. The inputs to transmission switch X1 are X1I at the gate of transistor MP3, and X1IB, the inverse of X1I, at the gate of transistor MN3. Transmission switch X1 couples node 22 to node 24 when the inputs X1I and X1IB turn transmission switch X1 on, and isolates node 22 from node 24 when the inputs X1I and X1IB turn transmission switch X1 off.

Transmission switch X2 is comprised of transistors MP4 and MN4 coupled between node 22 and node 26. The inputs to transmission switch X2 are X2I at the gate of transistor MN4 and X2IB, the inverse of X2I, at the gate of transistor MP4. Transmission switch X2 couples node 22 to node 26 when the inputs X2I and X2IB turn transmission switch X2 on, and isolate node 22 from node 26 when the input X2I and X2IB turn transmission switch X2 off.

Figure 2:
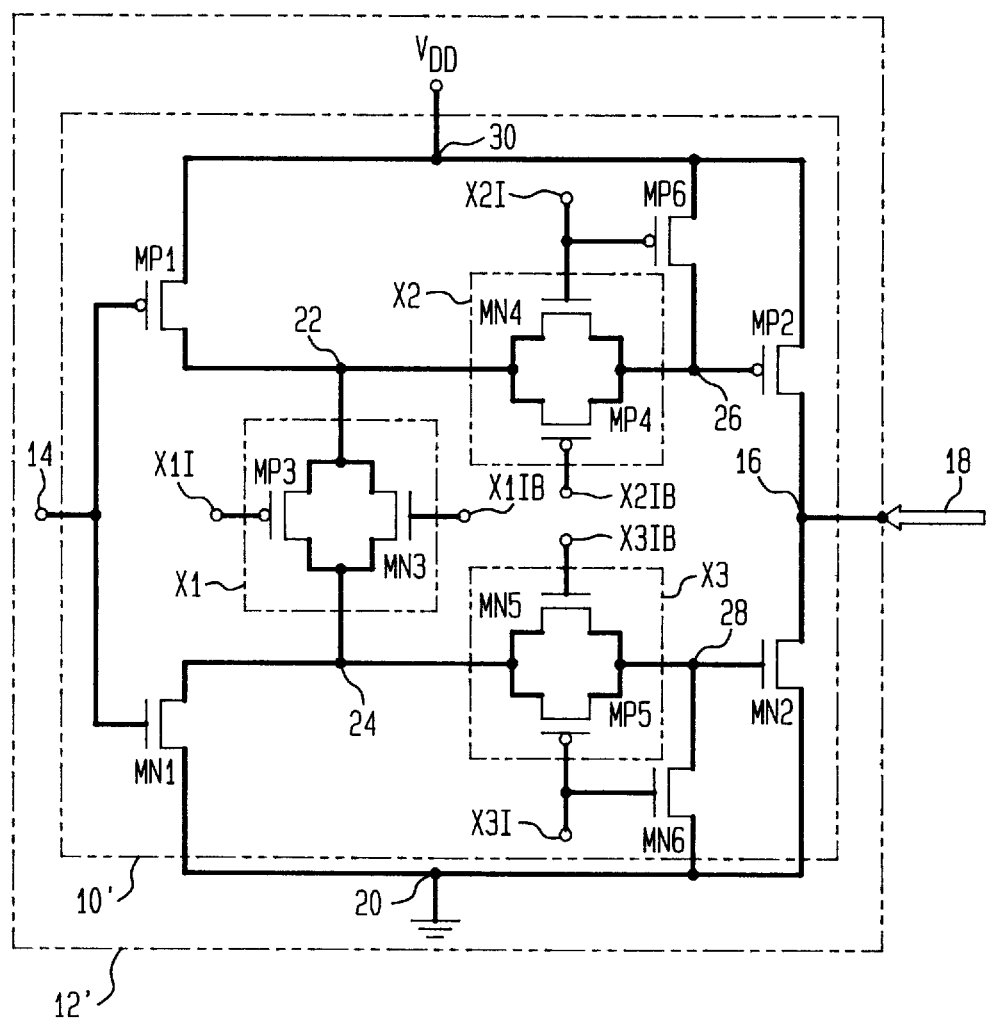
FIG. 2 is a schematic diagram of a three-state output driver circuit in an integrated circuit, configurable either as an open-drain driver circuit, or an open-source driver circuit.

An alternative illustrative embodiment of the invention is shown in FIG. 2. In the alternative illustrative embodiment, a transmission switch X3 is coupled between node 24 and the gate of transistor MN2. Node 28 is defined at the juncture of transmission switch X3 and the gate of transistor MN2. Transmission switch X3 is comprised of transistors MP5 and MN5 coupled between node 24 and node 28. The inputs to transmission X3 are X3I at the gate of transistor MP5, and X3IB, the inverse of X3I, at the gate of transistor MN5. Transmission switch X3 couples node 24 to node 28 when inputs X3I and X3IB turn transmission switch X3 on, and isolates node 24 from node 28 when inputs X3I and X3IB turn transmission switch X3 off.

Transistor MN6 is coupled between node 28 and reference potential 20. The source of transistor MN6 is coupled to node 28. The drain of transistor MN6 is coupled to the reference potential. The gate of transistor MN6 is coupled to input X3I of transmission switch X3.

Figure 3:
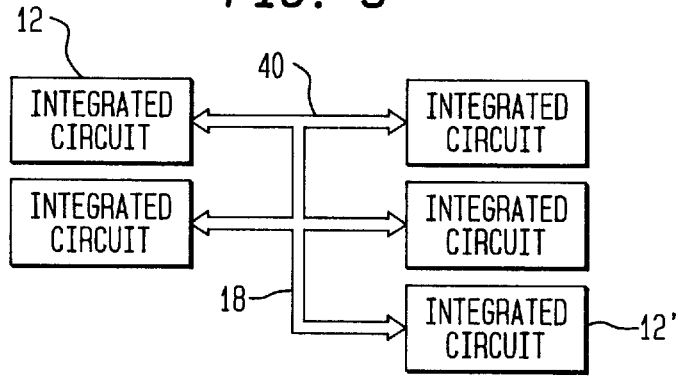
FIG. 3 is a block diagram of several integrated circuits interconnected by an open-drain bus.
Figure 4:
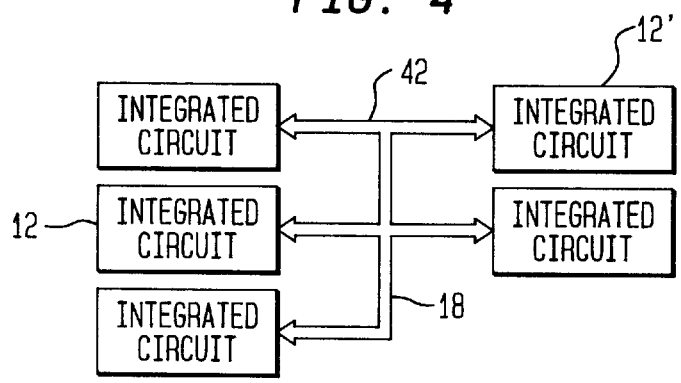
FIG. 4 is a block diagram of several integrated circuits interconnected by a three-state bus.
Figure 5:
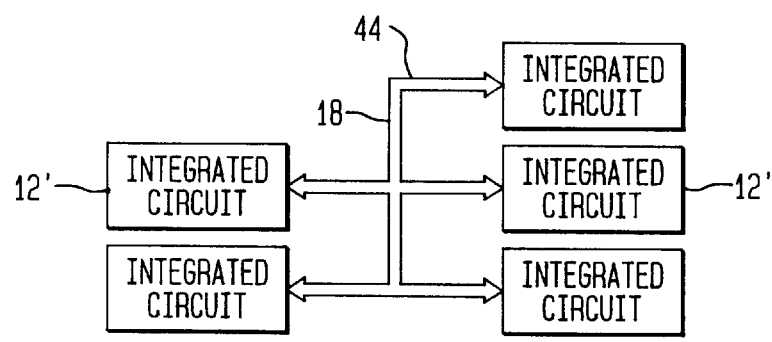
FIG. 5 is a block diagram of several integrated circuits interconnected by an open-source bus.

The illustrative embodiments of the embodiment are particularly useful in system applications employing several integrated circuits coupled to a single bus, generically 18, as shown in FIGS. 3, 4 and 5. Such integrated circuits may include microprocessors, microcontrollers, digital signal processors, memories, input interface devices, or any other integrated circuit that drives data onto a bus.

In operation, with X1I low, X1IB high, X2I high, and X2IB low, transmission switches X1 and X2 are in the on state and output driver circuit 10 (FIG. 1) operates as a three-state buffer, driving data presented at input node 14 to output node 16 and onto bus 18. Transmission switch X1 being in the on state couples node 22 to node 24. Similarly, transmission switch X2 being in the on state couples node 22 to node 26. Transistors MN6 and MP6 are in their off state and are thereby effectively removed from the circuit. Output driver circuit 10 reduces to a pair of cascaded inverters with the first inverter comprised of transistors MP1 and MN1, and the second inverter comprised of bus driving transistor MP2 as a pull-up transistor and transistor MN2 as a pull-down transistor. In this mode of operation, data provided at input node 14 is inverted twice and driven onto bus 18.

With X1I high, X1IB low, X2I low, and X2IB high, both transmission switches X1 and X2 are in the off state, and output driver circuit 10 operates as a three-state buffer in the high impedance state. Data presented at input node 14 is not driven onto bus 18. Transistor MN6 is in the on state and pulls the gate of transistor MP2 high, thereby holding transistor MP2 in the off state. Similarly, transistor MN6 is in the on state and pulls the gate of transistor MN2 low, thereby holding transistor MN2 in the off state. Bus 18 sees a high impedance at output node 16.

With X1I low, X1IB high, X2I low, and X2IB high, conditions are set for open-drain driving of data from input node 14 to output node 16 and onto bus 18. Transmission switch X1 is in the on state coupling node 22 to node 24 and maintaining transistor MN6 in the off state. The state of transistor MN2 will change state with the logic level of the data being driven onto the bus. Transmission switch X2 is in the off state isolating node 26 from node 22 and maintaining transistor MP6 in the on state. With transistor MP6 held in the on state, the gate of transistor MP2 is pulled high thereby maintaining transistor MP2 in the off state. Bus 18 can be pulled low by transistor MN2 but cannot be pulled high by transistor MP2. These operating conditions provide open-drain driving of data presented at input node 14 to output node 16 and onto bus 18.

A more versatile output driver circuit 10' is obtained by inclusion of a third transmission switch X3, as shown in FIG. 2. Transmission switch X3 is coupled between nodes 24 and 28, couples node 24 to node 28 when switched to be in the on state, and isolates node 24 from node 28 when switched to be in the off state. The gate of transistor MN6 is coupled to input X3I of transmission switch X3.

TABLE I

|  | X1 | X2 | X3 |
| --- | --- | --- | --- |
| three-state driving | 1 | 1 | 1 |
| three-state non-driving | 0 | 0 | 0 |
| open-drain driving | 1 | 0 | 1 |
| open-source driving | 1 | 1 | 0 |

In Table I, zero means that, in operation of an output driver circuit, a transmission switch is turned to the off state, whereas one means that a transmission switch is turned to the on state. As summarized in the upper left corner of Table I, output driver circuit 10' reduces to and operates identically to output driver circuit 10 when the state of transmission switches X1 and X2 take on the state described above, and transmission switch X3 is switched to be in the off state, or three-state non-driving operation, transmission switch X3 is switched to be in the on state for three-state driving and open-drain driving operation.

The purpose of the third transmission switch X3 is to provide independent control of the state of transistor MN2, in a manner similar to transmission switch X2 providing independent control of the state of transistor MP2 in the open-drain driving operation. By controlling transistor MN2 independently of transistor MP2, operating conditions can be achieved for open-source driving of data presented at input node 14 to output node 16 and onto bus 18.

With transmission switch X1 in the on state (X1I low and X1IB high) and transmission switch X2 in the on state (X2I high and X2IB low), transmission switch X3 is switched to be in the off state (X3I high and X3IB low). In the off state, node 24 is isolated from node 28, transistor MN6 is turned on and pulls the drain of transistor MN6 low, thereby turning off transistor MN2. Bus 18 can be pulled high by transistor MP2, but cannot be pulled low by transistor MN2. Transmission switches X1 and X2 being in the on state and transmission switch X3 being in the off state results in open-source driving of data presented at input node 14 to output node 16 and onto bus 18.

Bus 40 in FIG. 3 operates as a wired-AND bus with open-drain (open collector if TLL logic). Each integrated circuit coupled to the bus can pull the bus down, but not up. An elaborate protocol is not required. No harm is done to integrated circuits coupled to bus 40 if two integrated circuits coupled to bus 40 drive data onto the bus at the same time. Integrated circuits coupled to bus 40 could include integrated circuit 12 and 12' configured as conventional open-drain buffer circuits.

Bus 42 in FIG. 4 operates as a three-state bus. Each integrated circuit coupled to the bus is capable of pulling the bus up or down. A protocol is required to assure that, at a particular instant in time, a single driver can drive data onto the bus with all other drivers in a high impedance state. These conditions are necessary to avoid damage to the drivers and assure the data being driven onto the bus is not corrupted. Integrated circuits coupled to bus 42 could include integrated circuits 12 and 12' configured as three-state bus driver circuits.

Bus 44 in FIG. 5 operates as an open-source bus. Each integrated circuit coupled to the bus can pull the bus up, but not down. An elaborate protocol is not required. No harm is done to integrated circuits coupled to bus 40 if two integrated circuits coupled to bus 40 drive data onto the bus at the same time. Integrated circuits coupled to bus 44 could include integrated circuit 12' configured as an open-source bus driver circuit.

Logic signals X1I, X1IB, X2I, X2IB, X3I, and X3IB are generated to control the state of transmission switches X1I, X2I and X3I, and may be generated in any known manner.

While the illustrative embodiments of the invention have been described using P-channel transistors (designated "MP", followed by a reference numeral) and N-channel transistors (designated "MN", followed by a reference numeral) being switched to on and off states by logic high and logic low signals, one skilled in the art could design a circuit to achieve the same function in which the logic states differ from those in the illustrative embodiments. Such designs are contemplated within the scope of the invention.

While the illustrative embodiments of the invention have been described as output driver circuit useful for transferring data between an integrated circuit and a bus, the invention is also applicable to a circuit that provides both input to an integrated circuit from a bus, as well as output from an integrated circuit. Furthermore, it is also contemplated as being within the scope of the invention that as levels of integration increase, e.g., more and more circuit functions are fabricated on a single integrated circuit chip, that all or part of the bus may be on the same integrated circuit chip as the output driver circuit.

The invention claimed is:

1. An integrated circuit including a programmable output driver circuit, the programmable output driver circuit, comprising:

first and second transistors, each of said first and second transistors having first, second, and third terminals, the first terminal of each of the first and second transistors coupled together to form an input node, the second terminal of the first transistor coupled to a power node, the third terminal of the first transistor coupled to a first intermediate node, the second terminal of the second transistor coupled to a second intermediate node, the third terminal of the second transistor coupled to a reference potential:

a first switch having at least one input controllable independently of the programmable output driver circuit, the first switch coupled between the first intermediate node and the second intermediate node;

third and fourth transistors, each of the third and fourth transistors having first, second, and third terminals, the first terminal of the third transistor coupled to a third intermediate node, the first terminal of the fourth transistor coupled to the second intermediate node, the second terminal of the third transistor coupled to the power node, the third terminal of the third transistor coupled to the second terminal of the fourth transistor to define an output node, and the third terminal of the fourth transistor coupled to the reference potential; and a second switch having at least one control input controllable independently of the programmable output driver circuit, the second switch coupled between the third intermediate node and the first intermediate node.

2. An integrated circuit as recited in claim 1, further comprising:

a fifth transistor, the fifth transistor having first, second and third terminals, the first terminal coupled to the at least one control input of the first switch, the second terminal coupled to the second intermediate node, and the third terminal coupled to the reference potential.

3. An integrated circuit as recited in claim 1, further comprising:

a sixth transistor, the sixth transistor having first, second and third terminals, the first terminal coupled to the at least one control input of the second switch, the second terminal coupled to the power node, and the third terminal coupled to the third intermediate node.

4. An integrated circuit as recited in claim 1, wherein the first switch comprises a transmission switch.

5. An integrated circuit as recited in claim 1, wherein the second switch comprises a transmission switch.

6. An integrated circuit as recited in claim 1, wherein at least one of the transistors is a metal-oxide semiconductor.

7. An integrated circuit as recited in claim 1, further comprising:
a third switch having at least one control input, the third switch coupled between the second intermediate node and the first terminal of the fourth transistor.

8. An integrated circuit as recited in claim 7, wherein the third switch comprises a transmission switch.

9. An integrated circuit as recited in claim 7, further comprising a seventh transistor, the seventh transistor having first, second, and third terminals, the first terminal coupled to be at least one control input of the third switch, a second terminal coupled to the first terminal of the fourth transistor, and the third terminal coupled to the reference potential.

10. An integrated circuit as recited in claim 7, wherein at least one of the transistors is a metal-oxide semiconductor.

11. An integrated circuit as recited in claim 7, wherein an input of the third switch is controllable independently of the programmable output driver circuit.

12. An integrated circuit including a programmable output driver circuit, comprising:
first, second, third and fourth transistors, the first and second transistors configured to provide an input to the programmable output driver circuit and the third and fourth transistors configured to provide an output from the programmable output driver circuit;
a first switch coupled between the first and second transistors defining a first node at the first transistor, the first switch having at least one input controllable independently of the programmable output driver circuit; and
a second switch coupled between the first node and the third transistor, the second switch having at least one input controllable independently of the programmable output driver circuit.

13. An integrated circuit as recited in claim 12, wherein at least one of the first and second switches is a transmission switch.

14. An integrated circuit as recited in claim 12, further comprising:
a third switch coupled between the second and fourth transistors, the third switch having at least one input controllable independently of the programmable output driver circuit.

15. An integrated circuit as recited in claim 14, wherein the third switch comprises a transmission switch.

* * * * *